United States Patent
Aruga et al.

(10) Patent No.: US 8,687,365 B2
(45) Date of Patent: Apr. 1, 2014

(54) ELECTRONIC DEVICE, RACK SYSTEM HAVING THE SAME, AND METHOD FOR NOTIFYING ABNORMALITY

(75) Inventors: Kazuhiko Aruga, Kawasaki (JP); Eisuke Sato, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 244 days.

(21) Appl. No.: 13/200,370

(22) Filed: Sep. 23, 2011

(65) Prior Publication Data

US 2012/0044645 A1 Feb. 23, 2012

Related U.S. Application Data (63) Continuation of application No. PCT/JP2009/056688, filed on Mar. 31, 2009.

(51) Int. Cl.
*H05K 7/20* (2006.01)

(52) U.S. Cl.
USPC ........... 361/695; 361/679.48; 361/679.5; 361/679.49; 361/692; 361/694; 709/202; 709/203; 709/223; 709/224; 165/80.3; 165/104.33; 165/121; 165/122; 454/184; 714/39; 714/46; 714/47; 714/48

(58) Field of Classification Search
USPC ............ 361/679.46–679.54, 688, 689, 361/690–697, 715–728; 165/80.3–80.5, 165/104.33, 104.34, 121–127, 185; 454/184; 174/15.1, 16.3; 709/202, 203, 709/223, 224; 714/39, 46, 47, 48
See application file for complete search history.

(56) References Cited

U.S. PATENT DOCUMENTS

| | | | | |
|---|---|---|---|---|
| 5,949,646 | A | * | 9/1999 | Lee et al. ................ 361/695 |
| 6,011,689 | A | * | 1/2000 | Wrycraft ................ 361/695 |
| 6,054,823 | A | * | 4/2000 | Collings et al. .......... 318/400.04 |
| 6,532,151 | B2 | * | 3/2003 | Osecky et al. .......... 361/679.48 |
| 6,553,416 | B1 | * | 4/2003 | Chari et al. ............. 709/224 |
| 6,704,196 | B1 | * | 3/2004 | Rodriguez et al. ....... 361/679.33 |
| 6,722,971 | B2 | * | 4/2004 | Gough .................... 454/187 |

(Continued)

FOREIGN PATENT DOCUMENTS

| | | | |
|---|---|---|---|
| JP | 62-181498 | 8/1987 | |
| JP | 408148869 A | * 6/1996 | ............ H05K 7/20 |

(Continued)

OTHER PUBLICATIONS

International Search Report mailed on May 26, 2009 in corresponding PCT Application No. PCT/JP2009/056688.

*Primary Examiner* — Michail V Datskovskiy (74) *Attorney, Agent, or Firm* — Staas & Halsey LLP (57) ABSTRACT

An electronic device including a fan unit capable of setting an air blowing direction toward any of an interface plate side of a casing and a back plate side opposite to the interface plate; a power supply unit; a first housing portion capable of housing the power supply unit and provided within the casing to be close to the back plate; a second housing portion capable of housing the power supply unit and provided within the casing to be close to the interface plate; a detection portion that detects the air blowing direction of the fan unit and a position where the power supply unit is housed; and a warning portion that operates based on the detection portion to give a warning in a case where the air blowing direction of the fan unit is different from the side where the casing houses the power supply unit.

9 Claims, 8 Drawing Sheets

(56) References Cited

U.S. PATENT DOCUMENTS

| | | | |
|---|---|---|---|
| 6,735,081 B1 * | 5/2004 | Bishop et al. | 361/695 |
| 7,120,016 B2 * | 10/2006 | Suzuki et al. | 361/679.33 |
| 7,434,743 B2 * | 10/2008 | Barsun et al. | 236/49.3 |
| 7,675,747 B1 * | 3/2010 | Ong et al. | 361/679.48 |
| 7,983,039 B1 * | 7/2011 | Nguyen et al. | 361/695 |
| 8,068,340 B1 * | 11/2011 | Nguyen et al. | 361/695 |
| 8,320,120 B1 * | 11/2012 | Chan et al. | 361/679.49 |
| 2001/0028551 A1 | 10/2001 | Ota et al. | |
| 2004/0240177 A1 * | 12/2004 | Suzuki et al. | 361/695 |
| 2005/0036287 A2 * | 2/2005 | Kosugi | 361/695 |
| 2006/0176663 A1 * | 8/2006 | McEwan | 361/687 |
| 2008/0030954 A1 * | 2/2008 | Shieh | 361/700 |
| 2008/0218949 A1 * | 9/2008 | Hughes | 361/679 |

FOREIGN PATENT DOCUMENTS

| | | |
|---|---|---|
| JP | 2001-242963 | 9/2001 |
| JP | 2003-37385 | 2/2003 |
| JP | 2005-5651 | 1/2005 |
| JP | 2005-26266 | 1/2005 |
| JP | 2006-93547 | 4/2006 |

* cited by examiner

ELECTRONIC DEVICE, RACK SYSTEM HAVING THE SAME, AND METHOD FOR NOTIFYING ABNORMALITY

CROSS-REFERENCE TO RELATED APPLICATIONS

This application is a continuation application of PCT/JP2009/056688, filed on Mar. 31, 2009, the entire contents of which are incorporated herein by reference.

FIELD

The embodiments discussed herein are related to an electronic device and a rack system having the same.

BACKGROUND

There is known an electronic device such as a server device, a router device, and a switch device each equipped with a fan unit for cooling therein. Further, there is an electronic device capable of changing an air blowing direction of the fan unit. A technology relevant to such electronic devices is disclosed in Japanese Laid-open Patent Publication No. 2006-93547.

In such electronic devices, there is an electronic device equipped with a power supply unit with a fan. In cases where the posture of the fan unit is changed, an air blowing direction of the fan unit might be different from an air blowing direction of the fan of the power supply unit. In such a case, a cooling efficiency is degraded.

SUMMARY

According to an aspect of the embodiments, an electronic device includes: a fan unit that is capable of setting an air blowing direction toward any of an interface plate side of a casing and a back plate side opposite to the interface plate; a power supply unit; a first housing portion that is capable of housing the power supply unit and is provided within the casing to be close to the back plate; a second housing portion that is capable of housing the power supply unit and is provided within the casing to be close to the interface plate; a detection portion that detects the air blowing direction of the fan unit and a position where the power supply unit is housed; and a warning portion that operates based on the detection portion to give a warning in a case where the air blowing direction of the fan unit is different from the side where the casing houses the power supply unit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
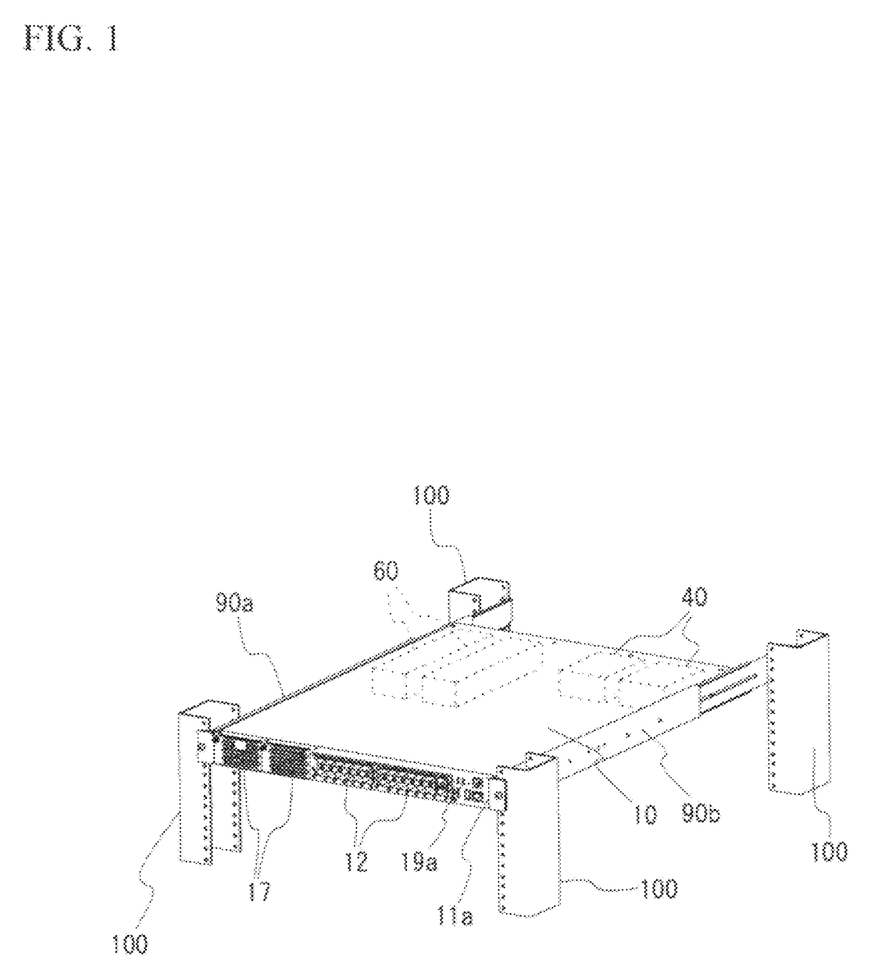
FIG. 1 is an explanatory view of a rack system.

FIG. 1 is an explanatory view of a rack system. The rack system includes an electronic device and a rack on which the electronic device is mounted.

The electronic device includes a casing 10. The casing 10 houses fan units 40 and power supply units 60 as will be described later in detail. The rack includes four pillars 100. Guide rails 90a and 90b are respectively bridged between a left pair of front and back pillars 100 and a right pair of front and back pillars 100. The casing 10, as will be described later in detail, is secured with the pillars 100 by the guide rails 90a and 90b. Connectors 12 are provided at an interface plate 11a of the casing 10. The connectors 12 are provided for connecting other devices. An LED 19a is provided at the interface plate 11a.

Figure 2:
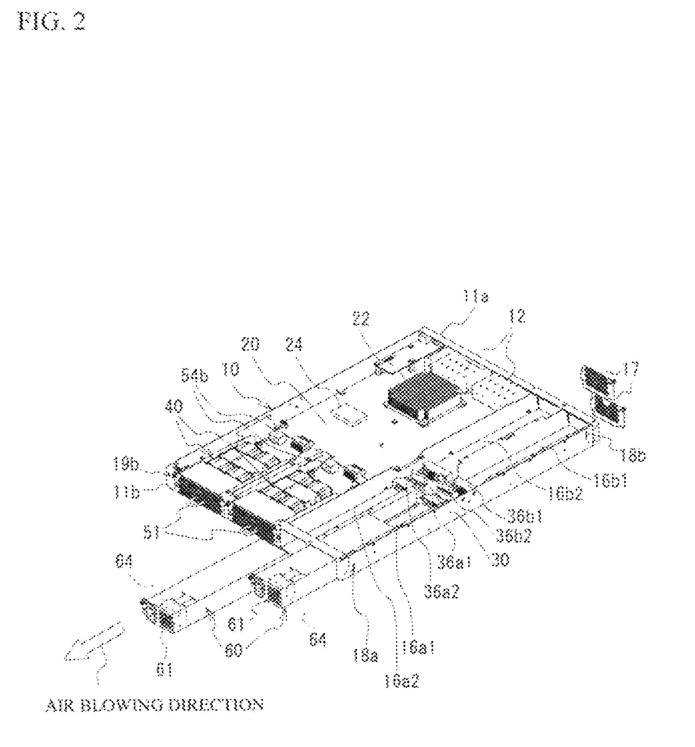
FIG. 2 is an explanatory view of an internal structure of an electronic device.
Figure 3:
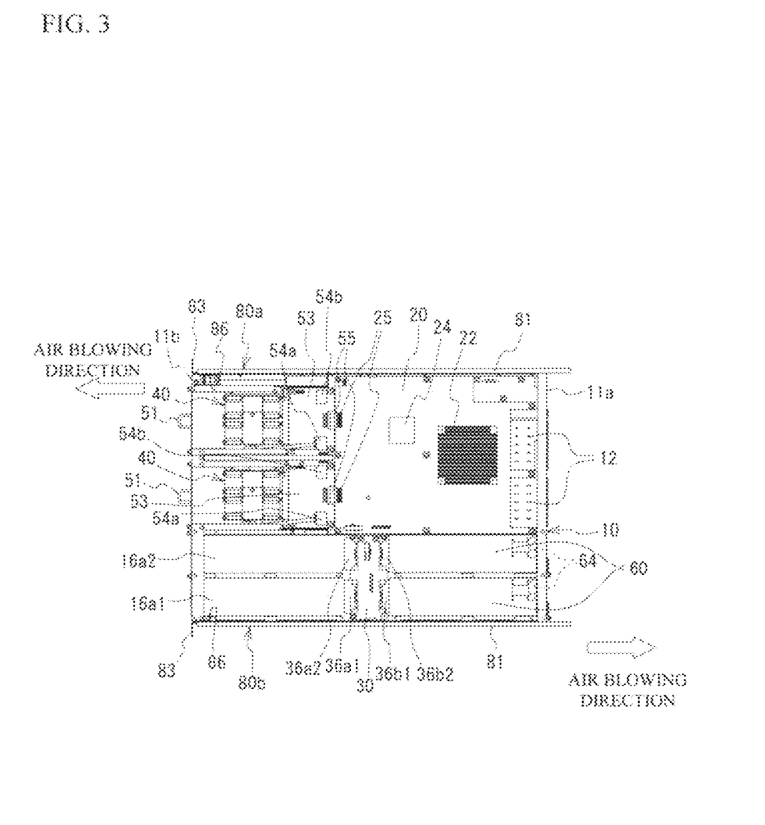
FIG. 3 is an explanatory view of the internal structure of the electronic device.

FIGS. 2 and 3 are explanatory views of an internal structure of an electronic device. Printed circuit boards 20 and 30 are provided within the casing 10. The printed circuit boards 20 and 30 are electrically connected to each other through a connector or the like. A heat sink 22 and a CPU 24 and the like are mounted on the printed circuit board 20. Further, in the casing 10, there is provided with housing portions 16a1, 16a2, 16b1, and 16b2 for housing two power supply units 60. The housing portions 16a1 and 16a2 are provided for inserting the power supply unit 60 thereinto, when the casing 10 is secured in the rack such that the interface plate 11a faces a front side of the rack. The housing portions 16a1 and 16a2 are provided relatively close to a back plate 11b. Further, the housing portions 16b1 and 16b2 are provided for inserting the power supply unit 60 thereinto, when the casing 10 is secured in the rack such that the back plate 11b opposite to the interface plate 11a faces the front side of the rack. The housing portions 16b1 and 16b2 are provided relatively close to the interface plate 11a. Therefore, even when the casing 10 is secured in the rack such that any of the interface plate 11a and the back plate 11b facing the front side of the rack, the power supply unit 60 that dissipates heat is positioned at a back side of the rack, and then air is exhausted to the back side of the rack. The housing portions 16a1 and 16b1 are communicated to each other, and the housing portions 16a2 and 16b2 are also communicated to each other. Further, the housing portions 16a1, 16a2, 16b1, and 16b2 each have a duct shape. The power supply unit 60 is insertable into and removable from the housing portions 16a1, 16a2, 16b1, and 16b2. The housing portions 16a1 and 16b1 are arranged in line along a side wall of the casing 10. The housing portions 16a2 and 16b2 are arranged close to the inside as compared with the housing portions 16a1 and 16b1. Additionally, FIG. 2 illustrates a state while the power supply units 60 are being removed from the housing portions 16a1 and 16a2 respectively.

The power supply unit 60A houses a fan 64. The power supply unit 60 is provided at its one end with an air blowing opening 61 for exhausting air blown from the fan 64. The fan 64 exhausts air toward the outside of the power supply unit 60. Further, the power supply unit 60 is provided at its other end with a connector. When the power supply unit 60 is inserted into the housing portion 16a1, 16a2, 16b1, or 16b2, it is inserted from the other end of the power supply unit 60. Therefore, the power, supply unit 60 housed in the housing portions 16a1 or 16a2 is different in the air blowing direction from the power supply unit 60 housed in the housing portion 16b1 or 16b2. In such a way, the housing portions 16a1 and 16a2 house the power supply units 60 in such postures that the air blowing directions are first directions relative to the casing 10 (the direction toward the back plate 11b). Further, the housing portions 16b1 and 16b2 house the power supply units 60 in such postures that the air blowing directions are second directions relative to the casing 10 (the direction toward the interface plate 11a). That is, as mentioned above, air is exhausted from the casing 10, in particular, always from the side of the power supply unit 60. This permits the heat of the power supply unit 60 itself not to be stayed within the casing 10.

The printed circuit board 30 is arranged between the housing portions 16a1 and 16a2 and the housing portions 16b1 and 16b2. Connectors 36a1, 36a2, 36b1, and 36b2 are mounted on the printed circuit board 30. The connectors 36a1 and 36a2 are an example of a first connector for a power supply unit. The connectors 36b1 and 36b2 are an example of a second connector for a power supply unit. The connector 36a1 is connected to a connector of the power supply unit 60 housed in the housing portion 16a1. The other connectors 36a2, 36b1, and 36b2 also have the same arrangements.

Further, two fan units 40 are housed within the casing 10. The fan unit 40 is housed at the back plate 11b side. The back plate 11b is opposite to the interface plate 11a. The fan unit 40 is capable of reversing its posture relative to the casing 10, thereby reversing the air blowing direction of the fan unit 40. Additionally, in the state illustrated in FIG. 2, the fan unit 40 and the power supply unit 60 are the same in the air blowing direction with each other, and air is exhausted from the positions of the power supply units 60 tending to have high-temperature heat, thereby preventing the air from being stayed within the casing 10.

Cases where the air blowing direction is reversed will be described. Firstly, the power supply units 60 are removed from the housing portions 16a1 and 16a2 as illustrated in FIG. 2. Next, the power supply units 60 are respectively inserted into the housing portions 16b1 and 16b2 as illustrated in FIG. 3. Additionally, at this time, the power supply unit 60 is inserted such that the air blowing opening 61 is arranged at the interface plate 11a side. In the state illustrated in FIG. 3, the fan unit 40 is different in the air blowing direction from the power supply unit 60. Next, the postures of the fan units 40 are reversed.

Figure 4A:
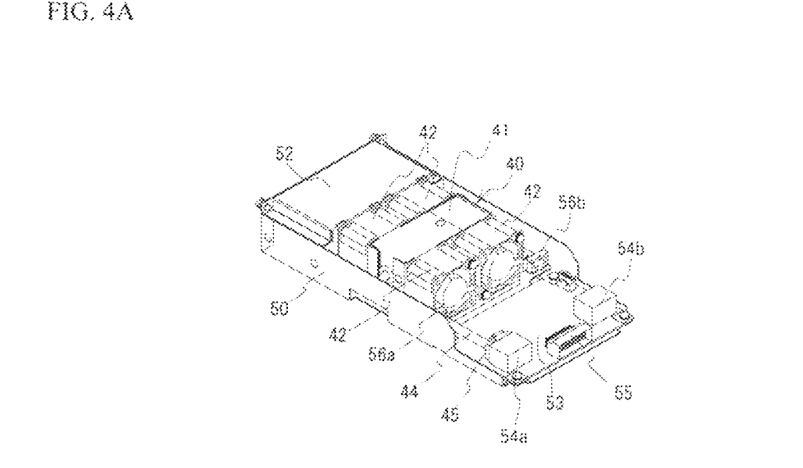
FIGS. 4A and 4B are explanatory views of a fan unit.
Figure 4B:
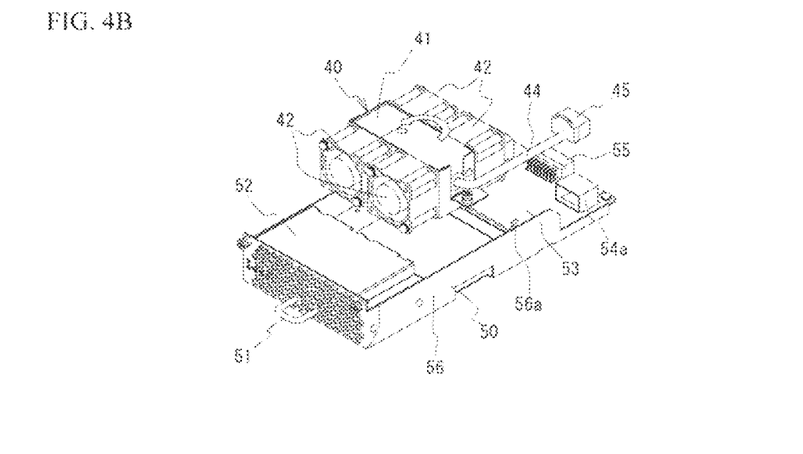

FIGS. 4A and 4B are explanatory views of the fan unit. The fan unit 40 is secured on a holding board 50. The holding board 50 is provided with a handle 51. The holding board 50 is insertable into and removable from the casing 10. The holding board 50 is removed from the casing 10 by pulling the handle 51. The fan unit 40 is secured on the holding board 50 by screws. The screws are removed, and the fan unit 40 is secured on the holding board 50 with the fan unit 40 being in a reverse posture.

The fan unit 40 includes: a tube portion 41; four fans 42; and a cable 44 provided in the tube portion 41. The tube portion 41 is formed with an air passage therewithin. The cable 44 ensures power supply. The cable 44 is provided at its one end with a connector 45. Each of the fans 42 is rotated in one direction by an actuator. Further, the holding board 50a holds a duct portion 52 and a printed circuit board 53. The duct portion 52 functions as a passage for blowing air. Connectors 54a and 54b are respectively mounted at the left and right sides of the printed circuit board 53. The connectors 54a and 54b are an example of a connector for a fan unit. A connector 55 is mounted at an edge of the printed circuit board 53. The length of the cable 44 is set to be alternatively connected to the connectors 54a and 54b based on the posture of the fan unit 40. That is, in the state illustrated in FIG. 4, the length of the cable 44 is set to be connectable to the connector 54a, but not to be connectable to the connector 54b.

The connectors 54a and 54b are electrically connected to the connector 55 through patterns on the printed circuit board 53. The connector 55 is connected to a connector 25 mounted on the printed circuit board 20. Additionally, as illustrated in FIG. 4, the holding board 50 is provided with holding members 56a and 56b for holding the cable 44. The holding members 56a and 56b are each made of a synthetic resin with elasticity. The holding members 56a and 56b each have a ring shape partially provided with a cutout. The holding members 56a and 56b are opened to hold the cable 44.

As illustrated in FIG. 4B, the fan unit 40 is removed from the holding board 50, and then the posture of the fan unit 40 is reversed. The fan unit 40 is secured on the holding board 50 again, and then the connector 45 of the cable 44 is inserted into the connector 54b. Next, the holding board 50 is inserted into the casing 10, whereby the connectors 55 and 25 are connected to each other. Therefore, the fan unit 40 and the printed circuit board 20 are electrically connected to each other. In such a manner, the air blowing direction of the fan unit 40 is reversed. Accordingly, the holding board 50 can hold the fan unit 40 in such a posture that the air blows in any of the first and second directions.

A description will be given of a change in the air blowing direction in the above manner. Plural electronic devices are mounted in the above mentioned rack. The plural electronic devices are connected to each other through cables. The electronic device has an interface plate provided with connectors to which the cables are connected. Generally, a server type device is designed to be secured in the rack such that its interface plate faces the back side of the rack, and a network type device such as a router and a switch is designed to be secured in the rack such that its interface plate faces the front side of the rack. Thus, in plural devices mounted in the same rack, the interface plates might not be arranged at the same side in many cases. Any devices are designed to exhaust air toward the back side of the rack. Thus, when the devices are secured in the rack, the air blowing directions of the devices are the same with each other. However, the interface plates of the devices are not arranged at the same side. Therefore, the cable for connecting both devices to each other has to be passed between both devices. For this reason, it is necessary to provide a space, in which the cable passes, between both devices arranged up and down and secured in the rack.

Further, when the plural devices are secured in the rack such that the interface plates thereof are arranged at the same side, the air blowing directions of the plural devices are not the same with each other. Thus, blowing air might interfere with each other to degrade the cooling efficiency of the whole rack.

However, as to the electronic device according to the present embodiment, the air blowing direction is changed for every device, thereby making the air blowing directions same with each other and preventing the cooling efficiency of the whole rack from being degraded even when the plural devices are secured in the rack such that the interface plates thereof are arranged at the same side. Moreover, the interface plates are arranged at the same side, thereby reducing the space between the plural devices. This can reduce space.

Figure 5A:
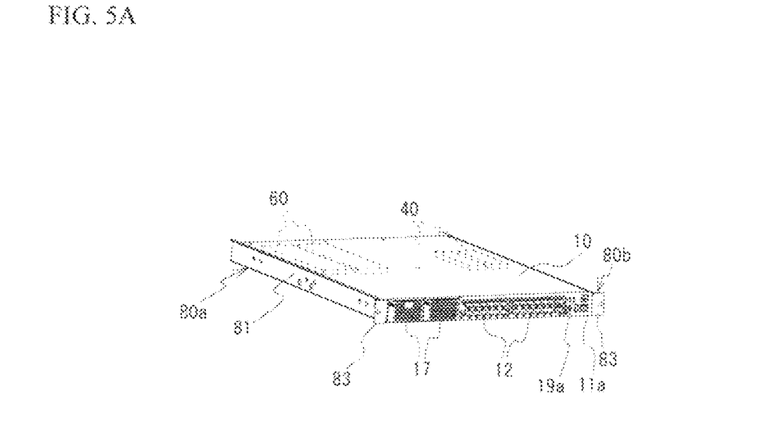
FIGS. 5A and 5B are explanatory views of a method for securing a casing in a rack.
Figure 5B:
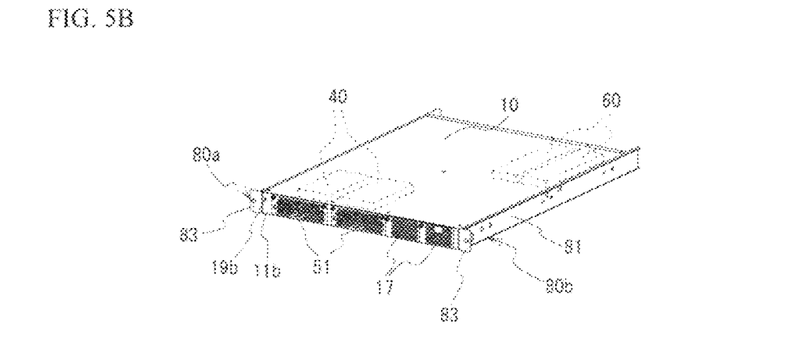
Figure 6:
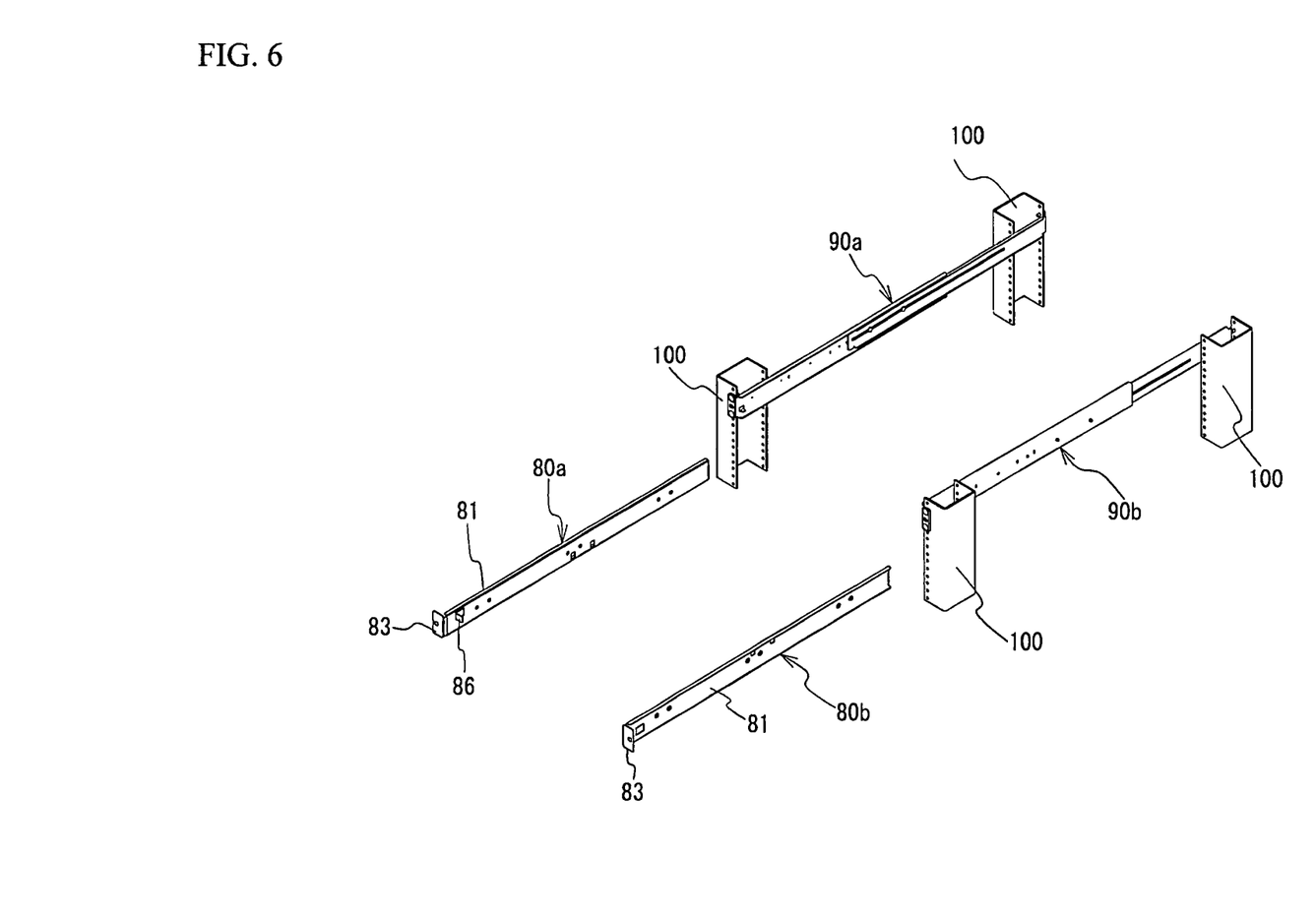
FIG. 6 is an explanatory view of the method for securing the casing in the rack.

Next, a method for securing the casing 10 in the rack will be described. FIGS. 5A, 5B, and 6 are explanatory views of the method for securing the casing 10 in the rack. FIG. 5A is an explanatory view of cases where the casing 10 as a network type device is secured in the rack such that the interface plate 11a faces the front side of the rack. Inner rails 80a and 80b are respectively secured at the side surfaces of the casing 10 such that securing pieces 83 are arranged at the interface plate 11*a* side. The inner rails 80*a* and 80*b* are secured in the rack by the screws. The inner rail 80*a* includes: a base portion 81 with a thin plate shape; the securing piece 83 positioned at one end of the base portion 81; and a projection piece 86 as will be described later. The other end of the base portion 81 is not provided with the securing piece 83. The securing piece 83 is perpendicular to the base portion 81. The securing piece 83 is provided with a hole through which the screw penetrates, the screw securing the securing piece 83 in the front pillar 100 of the rack.

FIG. 5 is an explanatory view of cases where the casing 10 as a network type device is secured in the rack such that the back plate 11*b* faces the front side of the rack. In cases where the casing 10 is secured in the rack such that the back plate 11*b* faces the front side of the rack, the inner rails 80*a* and 80*b* in the above case are replaced with each other and then secured on the opposite surfaces of the casing 10 in such postures that the securing piece 83 are positioned at the back plate 11*b* side. Additionally, cover plates 17 are provided for respectively covering the housing portions 16*a*1, 16*a*2, 16*b*1, and 16*b*2, and removable from the casing 10. The cover plate 17 is provided with plural holes for ensuring air flow.

As illustrated in FIG. 6, the guide rails 90*a* and 90*b* are connected to two pillars 100. The guide rails 90*a* and 90*b* support the inner rails 80*a* and 80*b* for sliding, respectively. When the electronic device is mounted in the rack, the guide rails 90*a* and 90*b* are engaged with the base portions of the inner rails 80*a* and 80*b*, respectively. Next, as illustrated in FIG. 6, the casing 10 is pushed and slid relative to the guide rails 90*a* and 90*b*, and then the securing pieces 83 of the inner rails 80*a* and 80*b* are secured in the pillars 100 respectively. The securing piece 83 is secured in the pillar 100 by a screw. Additionally, the casing 10 is omitted in FIG. 6.

Figure 7A:
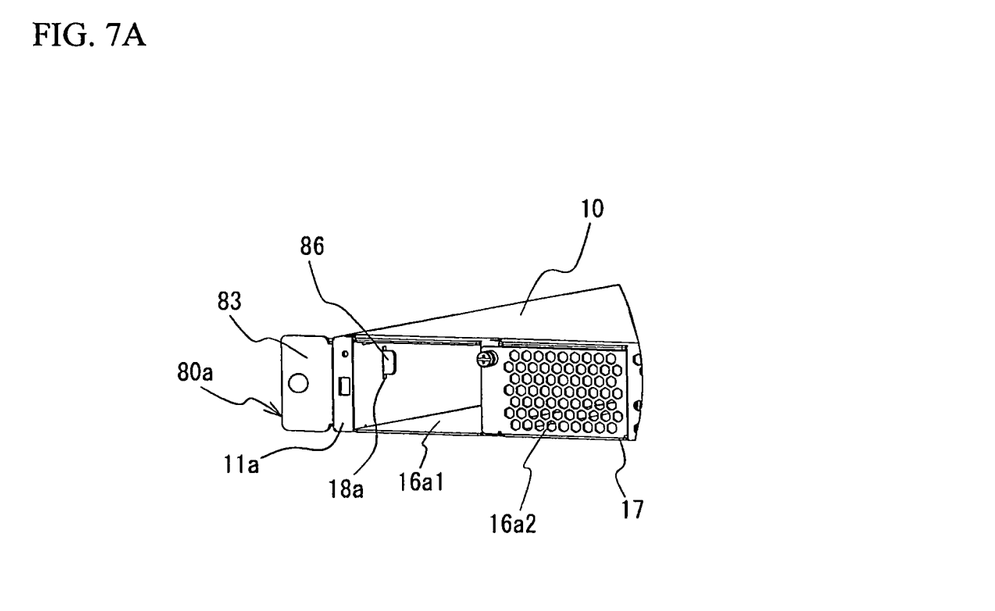
FIGS. 7A and 7B are explanatory views of inner rails.

Next, the inner rails 80*a* and 80*b* will be described in detail. FIG. 7A is an explanatory view of the inner rail 80*a* in cases where the casing 10 is secured in the rack such that the interface plate 11*a* faces the front side of the rack. The inner rail 80*a* is provided with the projection piece 86 at an inner side of the base portion 81. Further, the casing 10 is provided at its side surface facing the base portion 81 with a hole 18*a* through which the projection piece 86 penetrates. When the inner rail 80*a* is secured to the casing 10, the projection piece 86 projects into the housing portion 16*a*1 through the hole 18*a*. In other words, the projection piece 86 is inserted into the housing portion 16*a*1, which is closer to the securing piece 83, selected from the housing portion 16*a*1 or 16*b*1. Therefore, when being tried to be inserted into the housing portion 16*a*1, the power supply unit 60 interferes with the projection piece 86 projecting into the housing portion 16*a*1. Thus, the power supply unit 60 cannot be inserted into the housing portion 16*a*1. Further, in the state where the power supply unit 60 is inserted into the housing portion 16*a*1, the inner rail 80*a* cannot be attached such that the securing piece 83 of the inner rail 80*a* is arranged at the interface plate 11*a* side.

Figure 7B:
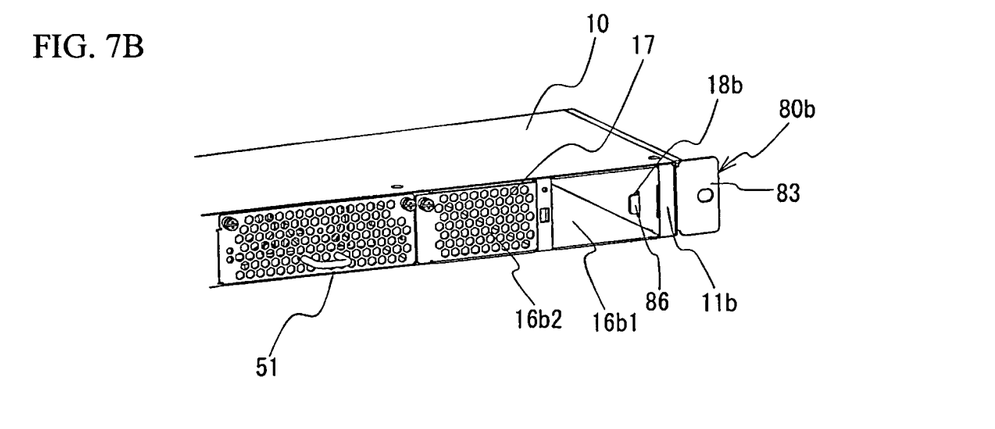

FIG. 7B is an explanatory view of the inner rail 80*b* in cases where the casing 10 is secured in the rack such that the back plate 11*b* faces the front side of the rack. The projection piece 86 of the inner rail 80*b* also projects into the housing portion 16*b*1, which is closer to the securing piece 83 of the inner rail 80*b*, selected from the housing portion 16*a*1 or 16*b*1. Therefore, the power supply unit 60 cannot be inserted into the housing portion 16*b*1. Further, in the state where the power supply unit 60 is inserted into the housing portion 16*b*1, the inner rail 80*b* cannot be attached such that the securing piece 83 of the inner rail 80*b* is arranged at the back plate 11*b* side.

As mentioned above, the power supply unit 60 cannot be housed at the front side of the rack. This reason is as follows. When the power supply unit 60 is housed at the front side of the rack, air is blown from the front side of the electronic device toward the outside thereof by the fan 64 of the power supply unit 60. Thus, air is blown toward the front side of the rack. Thus, the air blowing directions of this device and that of another device interfere with each other. However, in the electronic device according to the present embodiment, such a situation is avoided by the projection pieces 86 of the inner rails 80*a* and 80*b*.

Additionally, the casing 10 is also provided at its side surfaces opposite to the surfaces of the housing portions 16*a*1 and 16*b*1 side with holes for escaping the projection pieces of the inner rail.

Next, warning by use of LEDs 19*a* and 19*b* will be described. The LEDs 19*a* and 19*b* are examples of warning portions. The LED 19*a* is provided at the interface plate 11*a* side of the casing 10. The LED 19*b* is provided at the back plate 11*b* side of the casing 10. The LEDs 19*a* and 19*b* are lighted with power supply from the printed circuit board 20. The CPU 24 detects the postures of the fan units 40 and the power supply units 60. The CPU 24 detects the posture of the fan unit 40 based on whether or not the connector 45 of the fan unit 40 is connected to the connector 54*a* or 54*b*. The CPU 24 detects the posture of the power supply units 60 based on whether or not the power supply unit 60 is connected to the connector 36*a*1 or 36*a*2 or the connector 36*b*1 or 36*b*2.

When the detection result indicates that the fan unit 40 is different in the air blowing direction from the power supply unit 60, the CPU 24 controls the LEDs 19*a* and 19*b* to flash. Therefore, an operator can recognize that the fan unit 40 is different in the air blowing direction from the power supply unit 60. When the detection result indicates that the air blowing directions are the same with each other, the CPU 24 keeps the LEDs 19*a* and 19*b* off.

The cases where the air blowing directions are different from each other are, for example, cases where the connector 45 of the fan unit 40 is connected to the connector 54*a* and the connectors of the power supply units 60 are respectively connected to the connectors 36*b*1 and 36*b*2. For example, this is the state illustrated in FIG. 3. Further, they are cases where the connector 45 is connected to the connector 54*b* and the power supply units 60 are respectively connected to the connectors 36*a*1 and 36*a*2. The cases where the air blowing directions are the same with each other are, for example, cases where the connector 45 of the fan unit 40 is connected to the connector 54*a* and the power supply units 60 are respectively connected to the connectors 36*a*1 and 36*a*2. Further, they are cases where the connector 45 of the fan unit 40 is connected to the connector 54*b* and the power supply units 60 are respectively connected to the connectors 36*b*1 and 36*b*2.

Figure 8A:
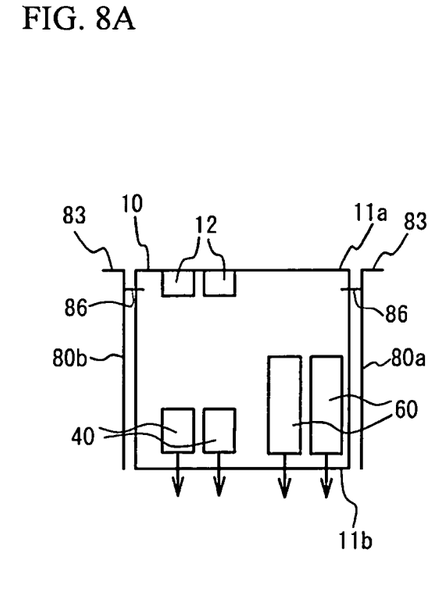
FIGS. 8A to 8D are explanatory views of warning.
Figure 8B:
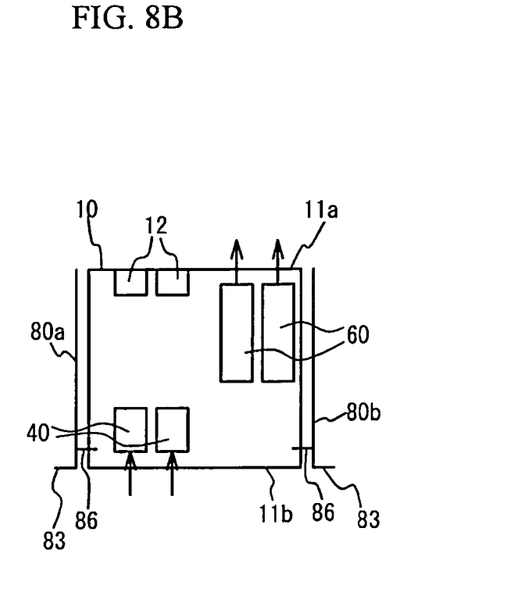
Figure 8C:
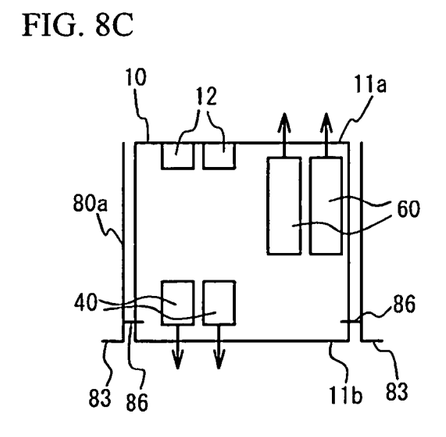
Figure 8D:
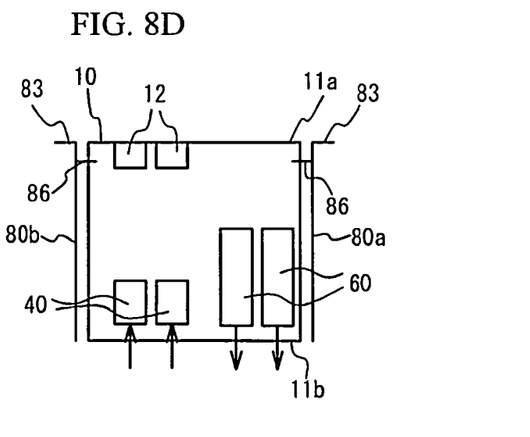

FIGS. 8A to 8D are explanatory views of cases where the warning is performed and cases where the warning is not given. Since the fan units 40 are the same in the air blowing direction with the power supply units 60 as illustrated in FIGS. 8A and 8B, the warning is not given. Since the fan units 40 are different in the air blowing direction from the power supply units 60 as illustrated in FIGS. 8C and 8D, the warning is given. That is, the CPU 24 controls the LEDs 19*a* and 19*b* to flash.

In such a way, the lighting pattern of the LEDs 19*a* and 19*b* are changed to give a warning to the operator. Additionally, not only in a case as illustrated in FIGS. 8C and 8D, but also a case where the CPU 24 may control the LEDs 19*a* and 19*b* to flash when one of two power supply units is inserted into the housing portion 16a1 or 16a2 and the other is inserted into the housing portion 16b1 or 16b2.

In the present embodiment, the change in the lighting pattern of the LEDs 19a and 19b gives to a warning to a user. The present invention is not limited to these arrangements. For example, a warning may be sounded to a user.

All examples and conditional language recited herein are intended for pedagogical purposes to aid the reader in understanding the invention and the concepts contributed by the inventor to furthering the art, and are to be constructed as being without limitation to such specifically recited examples and conditions, nor does the organization of such examples in the specification relate to a showing of the superiority and inferiority of the invention. Although the embodiment of the present inventions has been described in detail, it should be understood that the various changes, substitutions, and alterations could be made hereto without departing from the sprit and scope of the invention.

What is claimed is:

1. An electronic device comprising:
   a fan unit that is capable of setting an air blowing direction toward any of an interface plate side of a casing and a back plate side opposite to the interface plate;
   a power supply unit;
   a first housing portion that is capable of housing the power supply unit and is provided within the casing to be close to the back plate;
   a second housing portion that is capable of housing the power supply unit and is provided within the casing to be close to the interface plate;
   a detection means for detecting the air blowing direction of the fan unit and a position where the power supply unit is housed; and
   a warning means for giving a warning based on the detection means in a case where the air blowing direction of the fan unit is different from the side where the casing houses the power supply unit.

2. The electronic device of claim 1, further comprising:
   first and second connectors for the fan unit, the fan unit being alternatively connected to the first connector for the fan unit and the second connector for the fan unit based on the air blowing direction of the fan unit; and
   first and second connectors for the power supply unit, the power supply unit being alternatively connected to the first connector for the power supply unit and the second connector for the power supply unit based on the housed position of the power supply unit;
   wherein the detection means detects postures of the fan unit and the power supply unit based on a connection state of the fan unit and the first and second connectors for the fan unit and a connection state of the power supply unit and the first and second connectors for the power supply unit.

3. The electronic device of claim 1, wherein
   the casing is capable of securing an inner rail at an outer surface of the casing,
   the inner rail comprises:
      a base portion;
      a securing piece provided at one end of the base portion; and
      a projection piece provided in the base portion to be close to the securing piece,
   the projection piece projects into the first or second housing portion of the casing through a hole formed at a wall of the casing to prevent the power supply unit from being inserted into the first or second housing portion, when the inner rail is secured in the casing,
   the base portion of the inner rail is capable of engaging a guide rail bridged between front and back pillars of a rack in which the casing is mounted.

4. A rack system comprising:
   an electronic device that comprises:
      a fan unit that is capable of setting an air blowing direction toward any of an interface plate side of a casing and a back plate side opposite to the interface plate;
      a power supply unit;
      a first housing portion that is capable of housing the power supply unit and is provided within the casing to be close to the back plate;
      a second housing portion that is capable of housing the power supply unit and is provided within the casing to be close to the interface plate;
      a detection means for detecting the air blowing direction of the fan unit and a position where the power supply unit is housed;
      a warning means for giving a warning based on the detection means in a case where the air blowing direction of the fan unit is different from the side where the casing houses the power supply unit; and
      the casing that is provided with a hole at a given position of an outer side surface;
   a rack that comprises front and back pillars between which a guide rail is bridged, and
   an inner rail that comprises:
      a base portion that is engageable with the guide rail;
      a securing piece that is provided at one end of the base portion and is capable of being secured in the pillar; and
      a projection piece that is provided in the base portion and close to the securing piece, and the inner rail that is secured on an outer surface of the casing such that the projection piece is inserted into the hole to prevent the power supply unit from being inserted into the first or second housing portion.

5. An electronic device comprising:
   a fan unit that is capable of setting an air blowing direction toward any of an interface plate side of a casing and a back plate side opposite to the interface plate;
   a power supply unit;
   a first housing portion that is capable of housing the power supply unit and is provided within the casing to be close to the back plate;
   a second housing portion that is capable of housing the power supply unit and is provided within the casing to be close to the interface plate;
   first and second connectors for the fan unit, the fan unit being alternatively connected to the first connector for the fan unit and the second connector for the fan unit based on the air blowing direction of the fan unit; and
   first and second connectors for the power supply unit, the power supply unit being alternatively connected to the first connector for the power supply unit and the second connector for the power supply unit based on the housed position of the power supply unit.

6. The electronic device of claim 5, further comprising LEDs that are provided with the casing.

7. An electronic device comprising:
   a fan unit that is capable of setting an air blowing direction toward any of an interface plate side of a casing and a back plate side opposite to the interface plate;
   a power supply unit;
   a first housing portion that is capable of housing the power supply unit and is provided within the casing to be close to the back plate;

a second housing portion that is capable of housing the power supply unit and is provided within the casing to be close to the interface plate; and a CPU that executes:
  detecting the air blowing direction of the fan unit and a position where the power supply unit is housed; and
  controlling LEDs based on the detecting in a case where the air blowing direction of the fan unit is different from the side where the casing houses the power supply unit.

8. An electronic device comprising:

a casing; and a fan unit that is installed in the casing and draws or exhausts air through a first surface side of the casing based on an air blowing direction that is set in the fan unit, wherein a lightning state of LEDs notifies abnormality, when the air blowing direction is detected to be set so as to draw air in a case where a power supply unit that exhausts air through the first surface side of the casing is inserted into the casing from the first surface side.

9. An electronic device comprising:

a casing; and a fan unit that is installed in the casing and draws or exhausts air through a first surface side of the casing based on an air blowing direction that is set in the fan unit, wherein a lightning state of LEDs is changed to a different state based on whether the air blowing direction is set so as to draw or exhaust air in a case where a power supply unit that exhausts air through the first surface side of the casing is inserted into the casing from the first surface side.

* * * * *